United States Patent
Mattos et al.

(10) Patent No.: US 6,845,124 B2
(45) Date of Patent: Jan. 18, 2005

(54) INTEGRATED CIRCUIT FOR CODE ACQUISITION

(75) Inventors: Philip Mattos, Ruardean Woodside (GB); Marco Losi, Bollate (IT)

(73) Assignees: STMicroelectronics S.r.l., Agrate Brianza (IT); STMelectronics Limited, Bristol (GB)

( * ) Notice: Subject to any disclaimer, the term of this patent is extended or adjusted under 35 U.S.C. 154(b) by 0 days.

(21) Appl. No.: 10/632,564

(22) Filed: Aug. 1, 2003

(65) Prior Publication Data

US 2004/0119618 A1 Jun. 24, 2004

(51) Int. Cl.[7] ................................................ H04B 1/69
(52) U.S. Cl. ...................................... 375/150; 375/200
(58) Field of Search ............................... 375/150, 152, 375/200, 205, 207, 208, 206, 239, 243, 299, 343, 350; 341/100

(56) References Cited

U.S. PATENT DOCUMENTS

| | | | | |
|---|---|---|---|---|
| 5,144,641 A | * | 9/1992 | Akazawa et al. | 375/150 |
| 5,420,593 A | | 5/1995 | Niles | 342/357 |
| 5,467,367 A | * | 11/1995 | Izumi et al. | 375/142 |
| 5,856,997 A | * | 1/1999 | Mochizuki et al. | 375/150 |
| 5,914,933 A | * | 6/1999 | Cimini et al. | 370/208 |
| 5,966,411 A | | 10/1999 | Struhsaker | 375/332 |
| 5,999,561 A | | 12/1999 | Naden et al. | 375/206 |
| 6,041,074 A | * | 3/2000 | Nakamura | 375/142 |
| 6,201,843 B1 | * | 3/2001 | Kingston et al. | 375/350 |
| 6,289,041 B1 | | 9/2001 | Krasner | 375/152 |
| 6,775,319 B2 | * | 8/2004 | King et al. | 375/150 |
| 2002/0012387 A1 | | 1/2002 | Shakeri et al. | 375/150 |

FOREIGN PATENT DOCUMENTS

| | | |
|---|---|---|
| EP | 0 563 020 A2 | 9/1993 |
| EP | 0 880 238 A2 | 11/1998 |
| GB | 2 364 487 A | 1/2002 |
| WO | WO 01/35525 A1 | 5/2001 |

OTHER PUBLICATIONS

Wendt, P., "Nonrecursive and Recursive Stack Filters and their Filtering Behavior," *IEEE Transactions on Acoustics, Speech and Signal Processing* 38(12):2099–2107, Dec. 1990.

* cited by examiner

*Primary Examiner*—Michael Tokar
*Assistant Examiner*—Linh Van Nguyen
(74) *Attorney, Agent, or Firm*—Lisa K. Jorgenson; Dennis M. de Guzman; Seed IP Law Group PLLC

(57) ABSTRACT

A semiconductor integrated circuit for processing a plurality of received broadcast signals, such as GPS signals, is operable in two modes: acquisition and tracking. In an acquisition mode, a separate acquisition engine is used which includes a sample reducer for combining samples of a received signal for correlation with a locally generated version of a GPS code. A serial to parallel converter converts the reduced samples to parallel words which are correlated in parallel with locally generated words of the GPS code.

35 Claims, 11 Drawing Sheets

INTEGRATED CIRCUIT FOR CODE ACQUISITION

BACKGROUND OF THE INVENTION

1. Field of the Invention

The present disclosure relates generally to the acquisition and tracking of broadcast pseudo random codes, in particular but not exclusively to codes transmitted as part of a GPS signal.

2. Description of the Related Art

The Global Position System (GPS) is a well-known system which uses broadcast pseudo random codes to allow receivers to determine time differences, and hence relative positions, between a transmitter and receiver. The transmitters are satellites orbiting the earth in known orbit paths whose position at any given time is accurately known. Using received signals from four such satellites, a receiver can unambiguously determine its position using trigonometry to an accuracy dependent upon the repetition rate of the code, accuracy of components and other factors, such as the atmosphere and multipath reflections.

To increase accuracy, more than the minimum of four reference transmitters are usually tracked. There are around 24 satellites available for tracking in the GPS system, of which 8 are specified to be Avisible@ by a receiver at any given time. In fact, GPS receivers typically include 12 channels to allow up to 12 satellites to be tracked at once.

GPS satellites transmit two L-Band signals which can be used for positioning purposes. The reasoning behind transmitting using two different frequencies is so that errors introduced by ionospheric refraction can be eliminated.

The signals, which are generated from a standard frequency of 10.23 MHz, are L1 at 1575.42 MHz and L2 at 1227.60 MHz and are often called the carriers.

The frequencies are generated from the fundamental satellite clock frequency of $f_0$=10.23 MHz.

| Signal | Frequency (MHz) | Wavelength (cm) |
| --- | --- | --- |
| L1 | 154$f_o$ = 1575.42 | ~19 |
| L2 | 120$f_o$ = 1227.60 | ~24 |

Since the carriers are pure sinusoids, they cannot be used easily for instantaneous positioning purposes and therefore two binary codes are modulated onto them: the C/A (coarse/acquisition) code and P (precise) code.

Also it is necessary to know the coordinates of the satellites and this information is sent within the broadcast data message which is also modulated onto the carriers.

The coarse/acquisition (CA) code was so named as it was originally designed as a coarse position measurement signal on its own, or as an acquisition code to assist in looking onto the phase of the precise code. However, the CA code is now used generally both for acquisition and for position tracking, and so will be referred to simply as the CA code herein.

The C/A code is a pseudo random (PN) binary code (states of 0 and 1) having 1,023 elements, or chips, that repeats itself every millisecond. The term pseudo random is used since the code is apparently random although it has been generated by means of a known process, hence the repeatability.

Due to the chipping rate (the rate at which each chip is modulated onto the carrier) of 1.023 Mbps, the chip length corresponds to approximately 300 m in length and due to the code length, the ambiguity is approximately 300 km—i.e., the complete C/A code pattern repeats itself every 300 km between the receiver and the satellite.

The code is generated by means of a linear feedback register which is a hardware device representing a mathematical PRN algorithm.

The sequences that are used are known as Gold codes which have particularly good autocorrelation and cross correlation properties. The cross correlation properties of the gold codes are such that the correlation function between two different sequences is low—this is how GPS receivers distinguish between signals transmitted from different satellites.

The receiver needs to know the actual position of satellites in addition to knowing its relative position to them, and for that reason a data message is broadcast. The data message includes information describing the positions of the satellites and their health status.

Each satellite sends a full description of its own orbit and clock data (within the ephemeris information) and an approximate guide to the orbits of the other satellites (contained within the almanac information).

The data is modulated at a much slower rate of 50 bps and thus it takes 12.5 minutes to transmit all of the information. To reduce the time it takes to obtain an initial position, the ephemeris and clock data is repeated every 30 seconds. Parameters representing the delay caused by signal propagation through the ionosphere are also included within the data message.

The broadcast data message is modulo-2 added to the C/A code. This inverts the code and has the effect of also inverting the signal after correlation allowing the data to be recovered.

Binary biphase modulation (also known as binary phase shift keying [BPSK]) is the technique that is used to modulate the codes onto the initial carrier waves.

The codes are now directly multiplied with the carrier, which results in a 180 degree phase shift of the carrier every time the state of the code changes.

The modulation techniques also have the properties of widening the transmitted signal over a much wider frequency band than the minimum bandwidth required to transmit the information which is being sent. This is known as spread spectrum modulation and has the benefits of developing processing gain in the despreading operation within the receiver, and it helps prevent possible signal jamming.

The L1 signal is modulated by both the C/A code and the P code, though only the CA code is relevant to the present description. This is done by modulating one code in phase and the other in quadrature (i.e., they are at 90 degrees to each other).

A representation of the CA code, data message bits and the resultant signal spectrum is shown in FIG. 1. As can be seen, the thermal noise level is higher than the actual signal level. In fact, the thermal noise is around −110 dB per MHz whereas the signal itself is around −130 dB. To extract the CA code from the noise, use is made of the fact that the CA code is a known sequence and correlation is performed. The function performed is to integrate the received signal with a locally generated version of the CA code, as follow:

$$\int_0^{20ms} (\text{signal} + \text{noise}) \times CA \text{ code} = \int_0^{20ms} (\text{carrier} \times \text{data} \times CA \text{ code}) \times$$
$$CA \text{ code} + \int_0^{20ms} (\text{noise}) \times CA \text{ code}$$
$$= \int_0^{20ms} (\text{carrier} \times \text{data} \times 1) + (0)$$

As can be seen, the integration of white noise over the integration period is substantially zero, whereas the integration of the CA code×CA code is 1.

The result of the integration is that the noise component does not increase in signal level, but that (carrier×data component CA code is increased by 20,000=+43 dB. The signal to noise ratio is now:

−130 dB (signal)+110 dB (noise)+43 dB (integration gain)=+23 dB

The signal energy thereby becomes distinguishable from the noise. A digital signal processor 10 for performing the above function is shown in FIG. 2. Prior to digital processing, the received radio frequency (RF) signal is filtered within a radio chip (FIG. 2a) to reject parts of the signal not in the L1 bandwidth (a filter with central frequency 1575 MHz and bandwidth 20 MHz or narrower). The signal is then mixed with a sinusoid generated by a local oscillator, resulting in the generation of a signal with sum and difference frequency components. A further filter of around 2 MHz bandwidth selects the desired signal. The signal produced is an IF signal which is sampled by the downconverter 12 at a rate defined by the clock generator 14 to convert to digital. The rate is typically a multiple of 1.023 MHz which is the CA code chip rate (in this case 4.092 MHz).

The signal is then copied and sent into typically 12 separate channels 16, each channel being arranged to extract the code and carrier information for a particular satellite. A replica of the CA code for the particular satellite is generated by a prn 18 and correlated with the signal in each channel 16. Two replica codes are actually used for the correlations; one delayed (late) and one advanced (early). The early and late codes lie on the slope of the correlation function either side of the peak, and are used in continuous tracking of the code to reduce tracking error. The signal is then processed for the data modulation and carrier phase measurements. A locally generated carrier is generated by a numerically controlled oscillator (NCO) 22 and a second downconverter 20 used to reject images prior to an output block 24.

When correlating to acquire the signal the time and hence code phase of the incoming signal is an unknown. It is necessary, therefore, to compare 2×1,023=2,046 acquisition samples of the CA code signal for every possible relative position of the incoming and locally generated CA codes, with an integration period of typically 1 millisecond. It thus takes around 2 seconds to acquire the first satellite using one channel. Thereafter the position of the sequence is known and tracking requires only two correlations, rather than 2046, to maintain the tracking position within a few nanoseconds window of the early and late measurements.

We have appreciated the need for a large number of correlations for acquisition of signals, but only a few correlations to track the signals after acquisition. We have further appreciated disadvantages of known solutions which use large numbers of correlators.

BRIEF SUMMARY OF THE INVENTION

An embodiment of the invention provides a semiconductor integrated circuit for processing a received broadcast signal of a type having a known digital code to acquire the signal. The semiconductor integrated circuit includes a digital sampler configured to sample the received broadcast signal to produce a serial digital bit stream at a first clock rate, and a sample reducer arranged to receive the serial digital bit stream and to combine groups of N samples to produce a reduced serial digital bit stream. A serial to parallel converter is arranged to convert the reduced serial digital bit stream to a parallel bit stream of words comprising M bits, and to output the M bit words at a second clock rate being higher than the first clock rate. A correlator arrangement is arranged to receive the parallel bit stream of M bit words and to correlate in parallel with a locally generated version of the known digital code by correlating one of the M bit words of the parallel bit stream with an M bit word of the locally generated version of the known digital code every cycle of the second clock rate, wherein an increase in throughput correlation speed is achieved.

BRIEF DESCRIPTION OF THE SEVERAL VIEWS OF THE FIGURES

Embodiments of the invention will now be described by way of example only and with reference to the accompanying figures, in which.

DETAILED DESCRIPTION

Embodiments of an integrated circuit for code acquisition are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
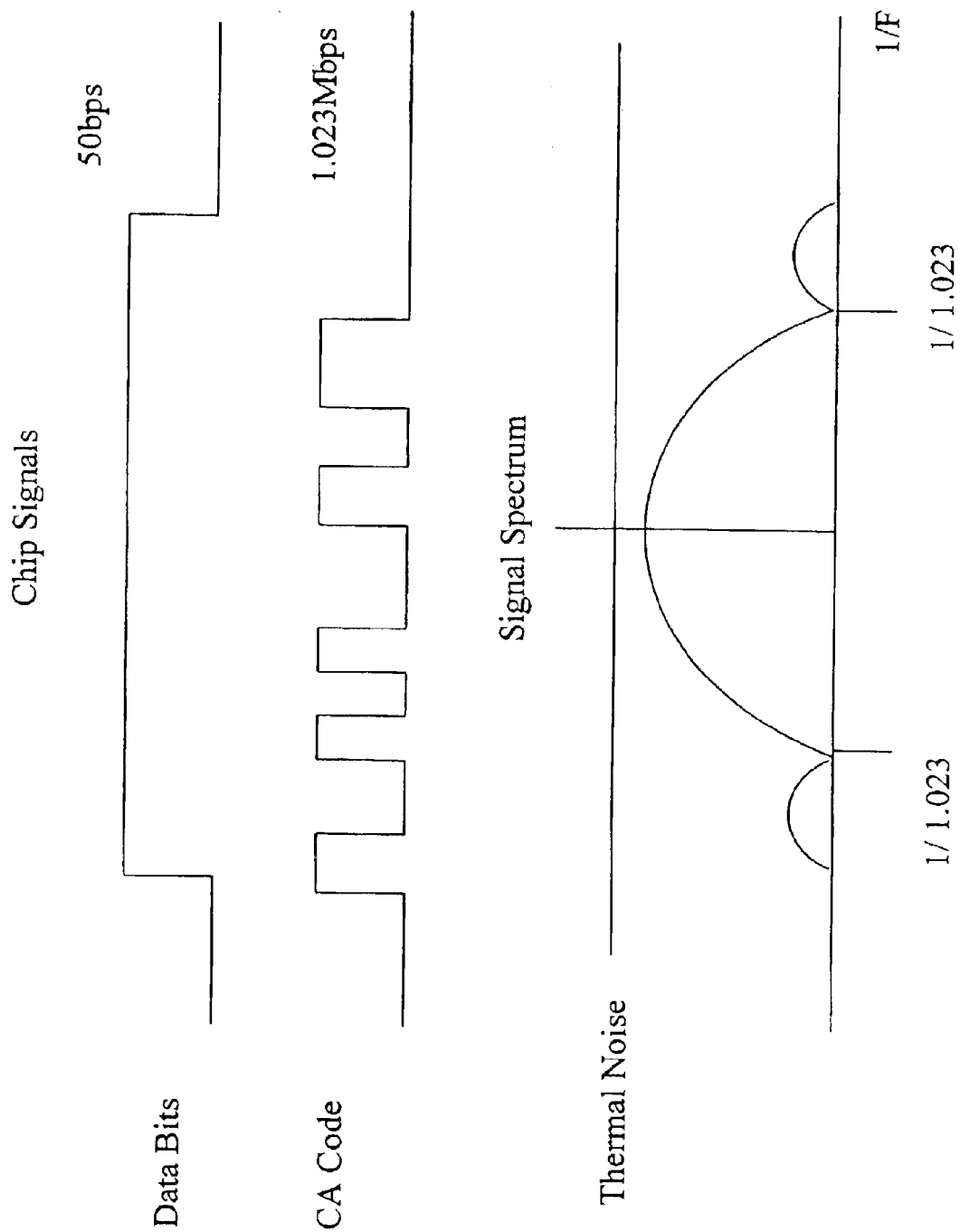
FIG. 1: is a representation of a repeated CA code as used in one embodiment of the present invention and its signal spectrum.
Figure 2:
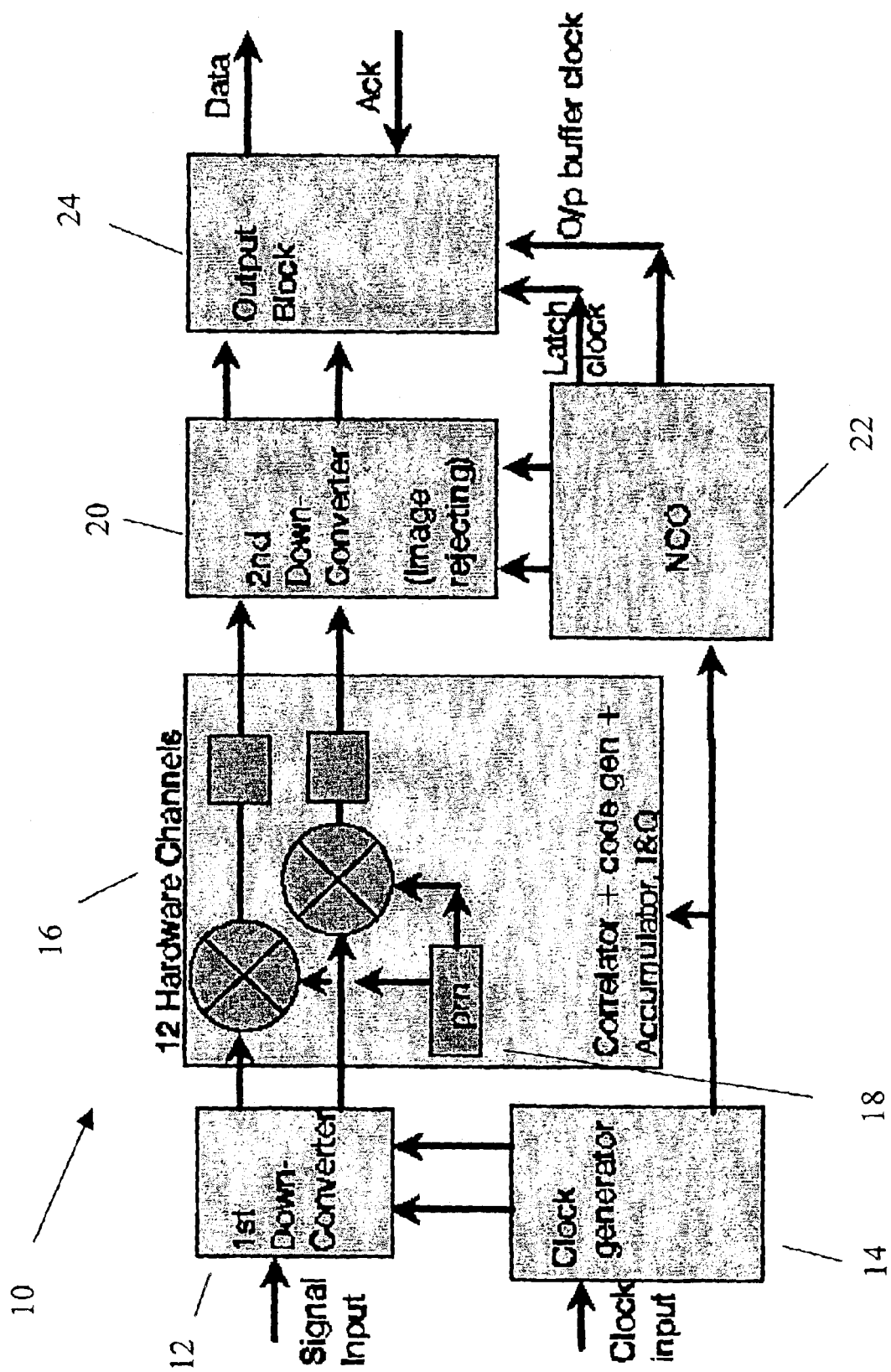
FIG. 2: shows a signal processor.

An embodiment of the invention is a digital signal processor (DSP) 10 for GPS signal acquisition and tracking as previously described in relation to FIG. 2, but modified to include additional functionality, which is operable to increase the speed of signal acquisition. The DSP 10 shown in FIG. 2 comprises a signal input to a first down converter 12, as previously described, which converts a received IF signal containing a repeated code input to digital at the sampled rate defined by clock generator 14, which is a multiple of (1.023 MHz). The digital signal is then provided to a series of 16 channels 16, each used to track one of up to 16 satellites simultaneously in a tracking mode. In tracking mode the respective CA code for a given satellite is fed to the respective channel 16 from a code generator shown as prn 18. When adapted according to an embodiment of the invention, a separate acquisition engine is used to acquire the signal. Of particular benefit is that the acquisition engine embodying the invention can perform greater than 2,046 correlations in real time, without requiring a large number of separate hardware correlators.

An embodiment allows integration of all possible code phase delays simultaneously, and continues to do so for an arbitrarily long period.

Figure 3:
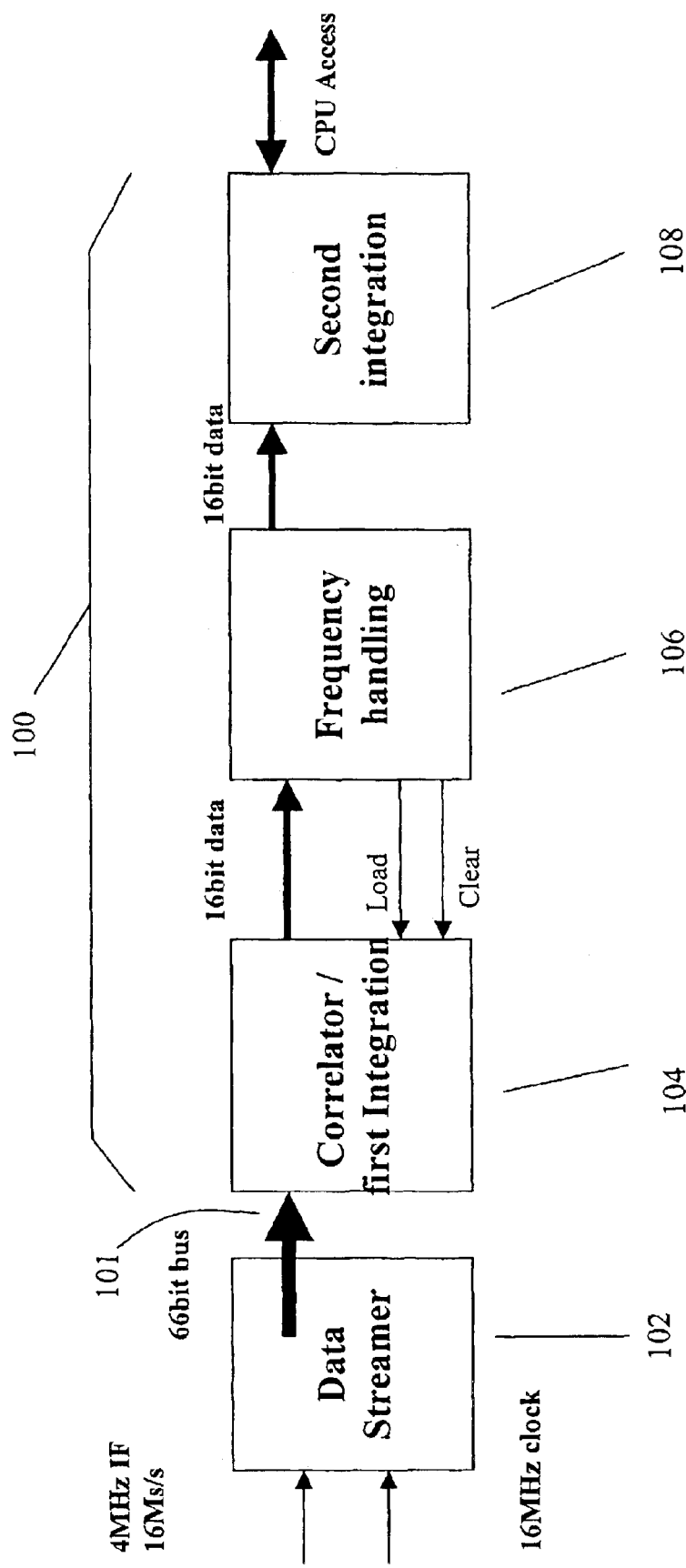
FIG. 3: shows the signal processing arrangement of an embodiment of the invention.

The received signal is down converted, filtered and then digitized by sampling at 16 MHz (in fact 16.368 MHz in one example embodiment) to produce a digital output. The main components of a digital signal processor code acquisition circuit of one embodiment of the invention are shown in FIG. 3. A data streamer 102 receives the down converted and digitized received signal and processes the signal to increase the data rate provided to a subsequent acquisition engine 100. In the acquisition mode, the acquisition engine performs correlations on the received digitized signal at a faster than usual rate to speed up the acquisition process. In a tracking mode, the data streamer 102 and acquisition engine 100 are switched off and the usual correlation channels (FIG. 2) are used. The acquisition engine 100 comprises a first correlator arrangement 104 for correlating the signal from the data streamer 102 with one of the satellite CA codes, a frequency handling arrangement 106 for correcting frequency errors and a second integration arrangement 108.

To ease understanding, only one channel is shown for the data streamer 102, correlator 104 and second integration 108, though it will be appreciated that there are in practice two channels according to an embodiment, one for In phase (I), one for Quadrature (Q). These are mathematically processed together in the frequency handling arrangement 106.

Figure 4:
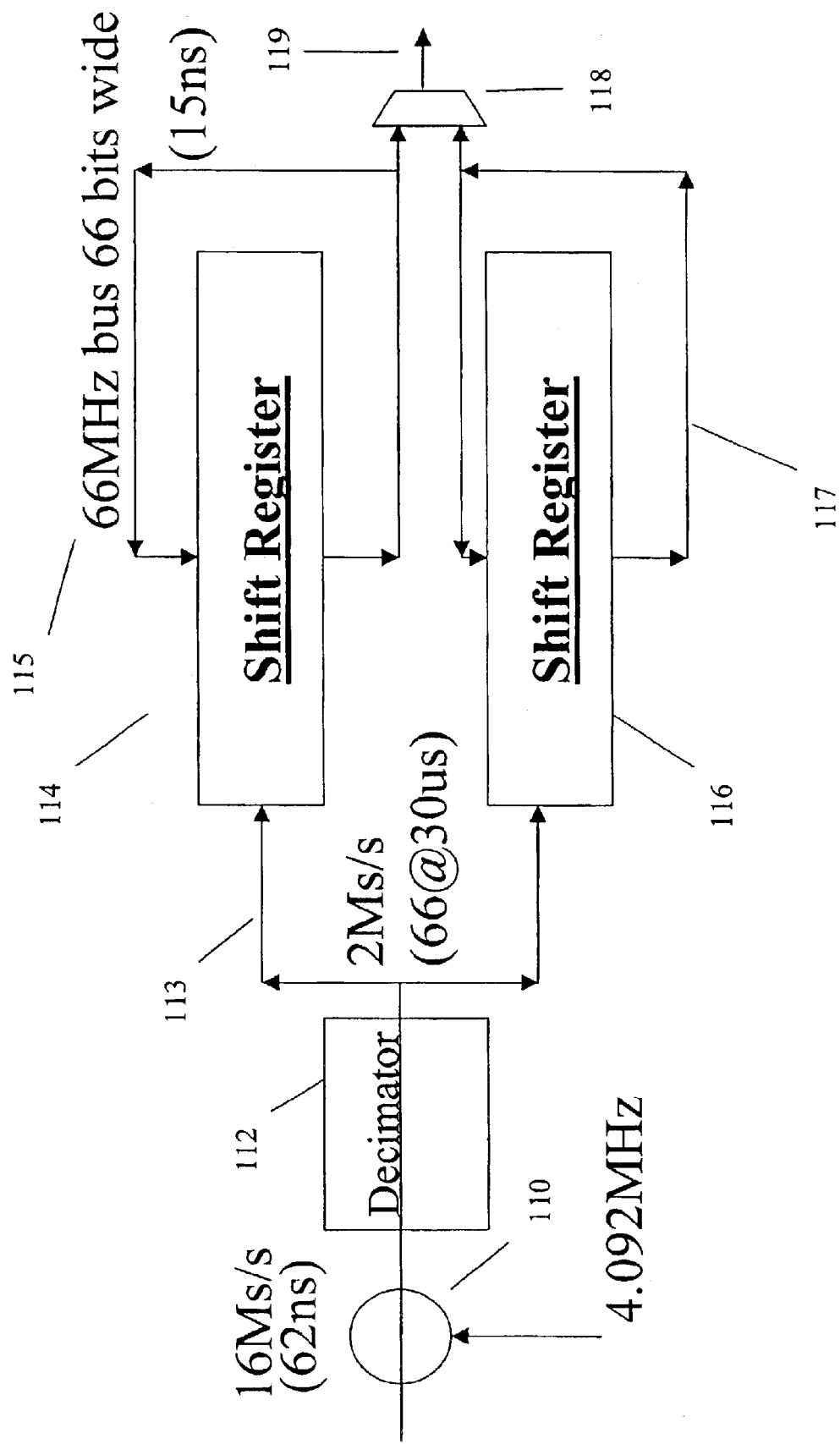
FIG. 4: shows an embodiment of the data streamer of FIG. 3 in greater detail.

The data streamer 102 takes the serial bit stream of the received down converted and digitized signal and processes this to produce a 66-bit parallel stream on bus 101. One embodiment of the data streamer 102 is shown in greater detail in FIG. 4. A mixer 110 fed with a locally generated 4.092 MHz provides serial (1-bit) data at 16 Ms/s to a decimator 112. The decimator 112 (described later) takes the 16 Ms/s one-bit signal and processes the signal to produce samples at a rate of 2 Ms/s, that is a factor of 8 reduction in the sample rate and packs them 66 bits wide giving a 66 fold increase in throughput (from 1-bit to 66-bit bus). The data into the data streamer 102 is clocked at 16 MHz which is 8 times the 2 MHz sample rate so an effective 8×66=528 increase in throughput is achieved. Taken with the increase in clock speed of the shift registers (described below) to 66 MHz (from 16 MHz) of a factor of 4, the throughput is increased overall by 8×66×4=2112 of the correlators. This is greater than the 2,046 correlations required with the result that all required correlations can be performed in real time.

The decimator 112 provides an output selectively to one of two shift registers 114, 116 which are parallel 66-bit shift registers of depth 31 words so that every 31 clock cycles the same 66-bit word (row of data) repeats. As can be seen, the shift registers 114, 116 are parallel-in-parallel-out (PIPO) type and circulate using 66-bit buses 115, 117.

A multiplexer 118 selectively chooses the output of the first shift register 114 or the second shift register 116 so that while data is loading into one, it can be repeatedly read from the other. The output shift register is clocked at substantially 664 MHz (in fact exactly 65.472 MHz) so that 66×31=2046 complete cycles of the date are executed per Ms. As an alternative arrangement, the decimator could provide a serial 1-bit output and the serial/parallel conversion could be done in the shift registers. In either case, the output on bus 119 is a 66-bit wide signal which is a combinatorial combination of the input signal. The combination is determined by the decimator 112 as will now be described.

Figure 5:
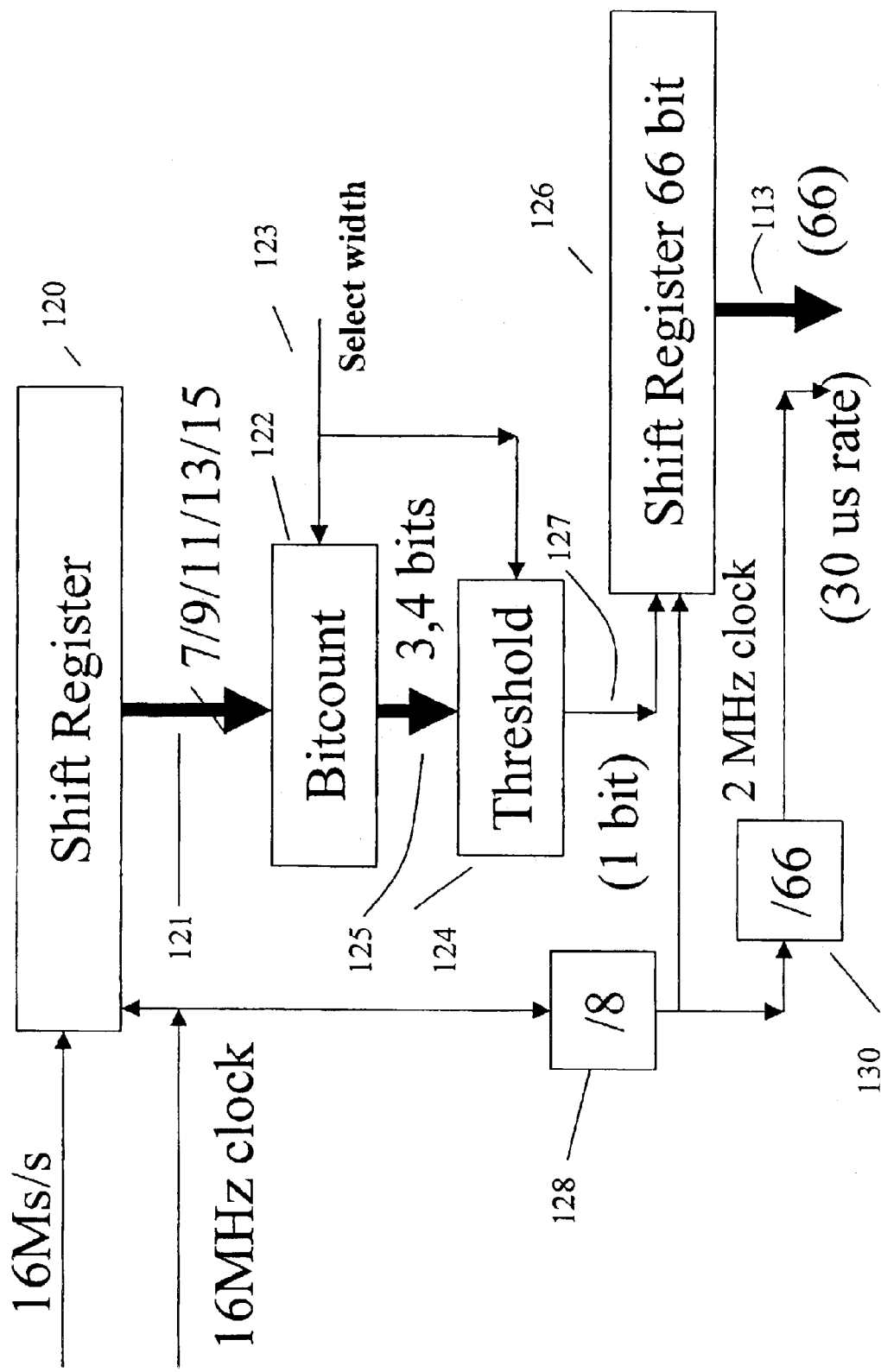
FIG. 5: shows an embodiment of the decimator of FIG. 4 in greater detail.

One embodiment of the decimator 112, as shown in FIG. 5, takes in the 1-bit received bit stream and produces a 66-bit parallel stream as a result. The input data is shifted into an input shifter register 120 8 bits at a time. The shift register 128 itself could optionally be 7, 9, 11, 13 or 15 bits wide as shown, though in an embodiment, for programmability is chosen to be 15 bits wide allowing any of these widths to be selected. If programmed to be 13 bits, then because only 8 bits are shifted in at a time, 5 bits of the received signal are effectively re-used each cycle. The shift register 120 reads out the data in parallel on bus 121 which is also programmable to match the register itself. A bit counter 122 receives the 13 bit parallel data and counts the number of bits that are logic "1". A select width signal allows the number of bits that are counted to be selected according to the effective shift register and bus widths chosen. The output on bus 125 is thus a count of the number of bits that are logic "1" which is provided to a threshold detector 124 which determines whether the number of bits is greater than the median (half the number of bits counted). The threshold is also selected by the select width signal 123. If above the median, then the threshold detector produces a logic "1" on line 127, if below then logic "0" is produced. A combination of 13 bits is thereby reduced to 1-bit indicative of whether a majority or minority of the samples are logic "1", though the data compression ratio is 8:1 because only 8 bits are shifted and 5-bit overlap discussed above.

A second shift register 126 of 66-bit width receives the 1-bit line 127 at a clock rate of 2 MHz, being divided by 8 by divider 128 from the 16 MHz clock input of the first shift register to take account the factor of 8 reduction in bits. The second shift register 126 then reads out 66 bits at a time in parallel on bus 113 which also has a 66-bit width, at a rate divided by 66 by divider 130 from the 2 MHz input clock. As a result, the 16 MHz 1-bit input rate has become a 2/66 MHz 66-bit parallel output. This is fed to the two shift registers 114, 116 as previously described in relation to FIG. 4, which increases the output rate to 66 MHz.

Figure 2A:
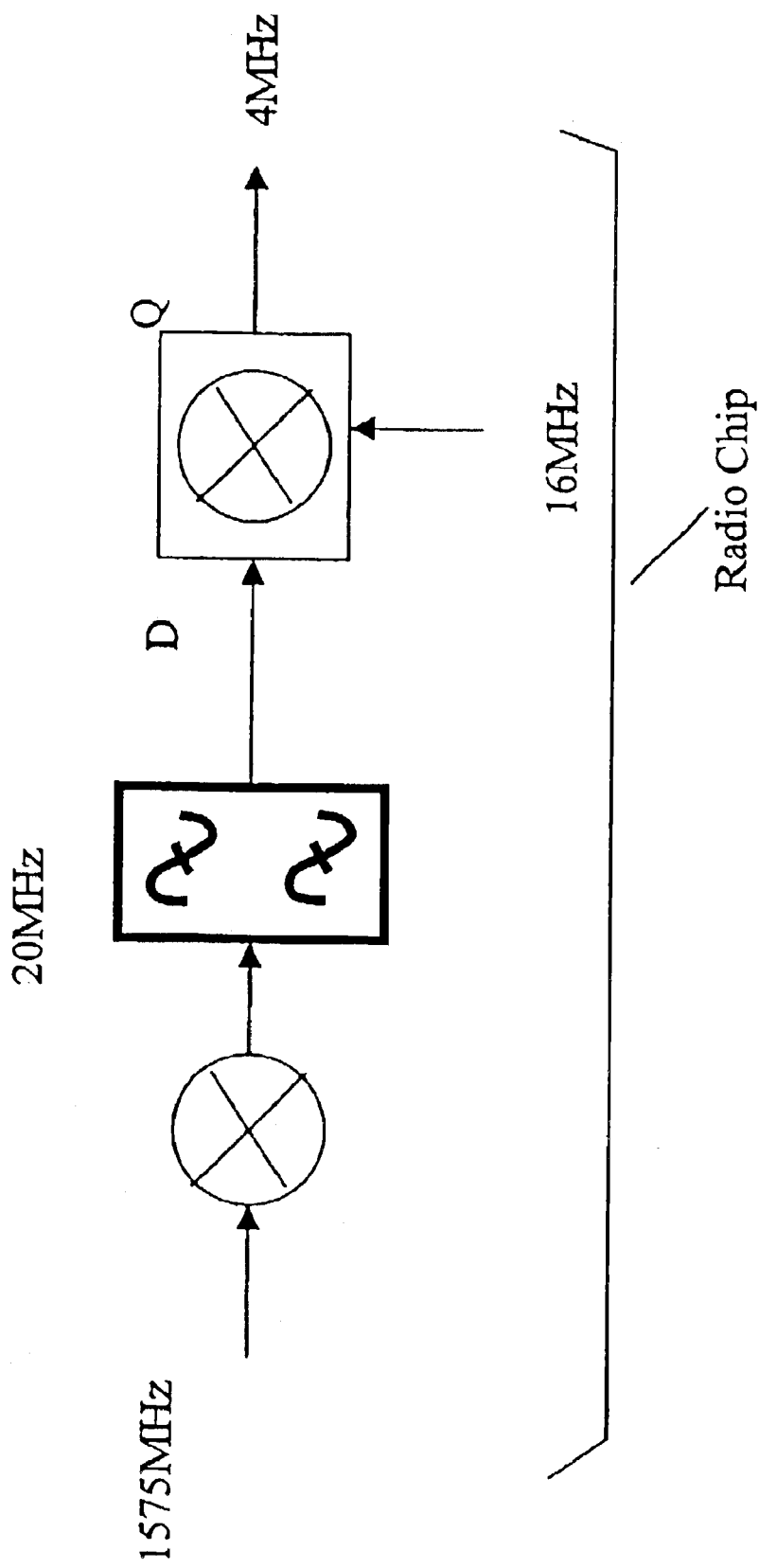
FIG. 2a: shows a radio chip.
Figure 6:
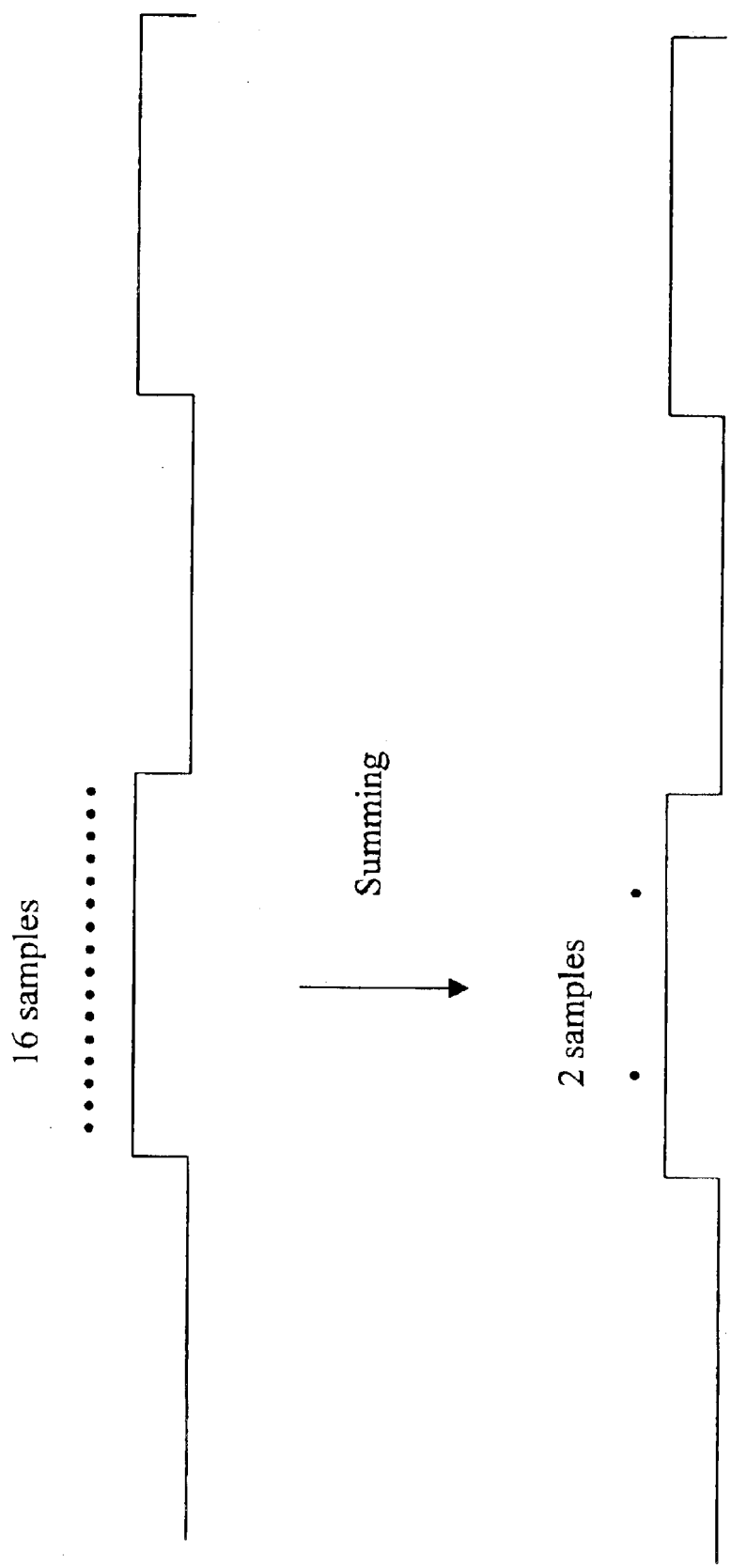
FIG. 6: shows diagrammatically the summing of data samples.

Whilst at first sight it may appear that information is lost by summing received samples, this is not the case as can be seen with reference to FIG. 6, though time accuracy is lost. The initial sampling of the received signal is at 16 MHz (FIG. 2a) producing 16 samples per CA code chip (the chip rate being 1 MHz). Thus the combination of 8 samples effectively produces 2 samples per CA code chip. The 2

MHz adequately represents the code for acquisition purposes, whilst 16 MHz is required for tracking where time precision is essential.

Figure 7:
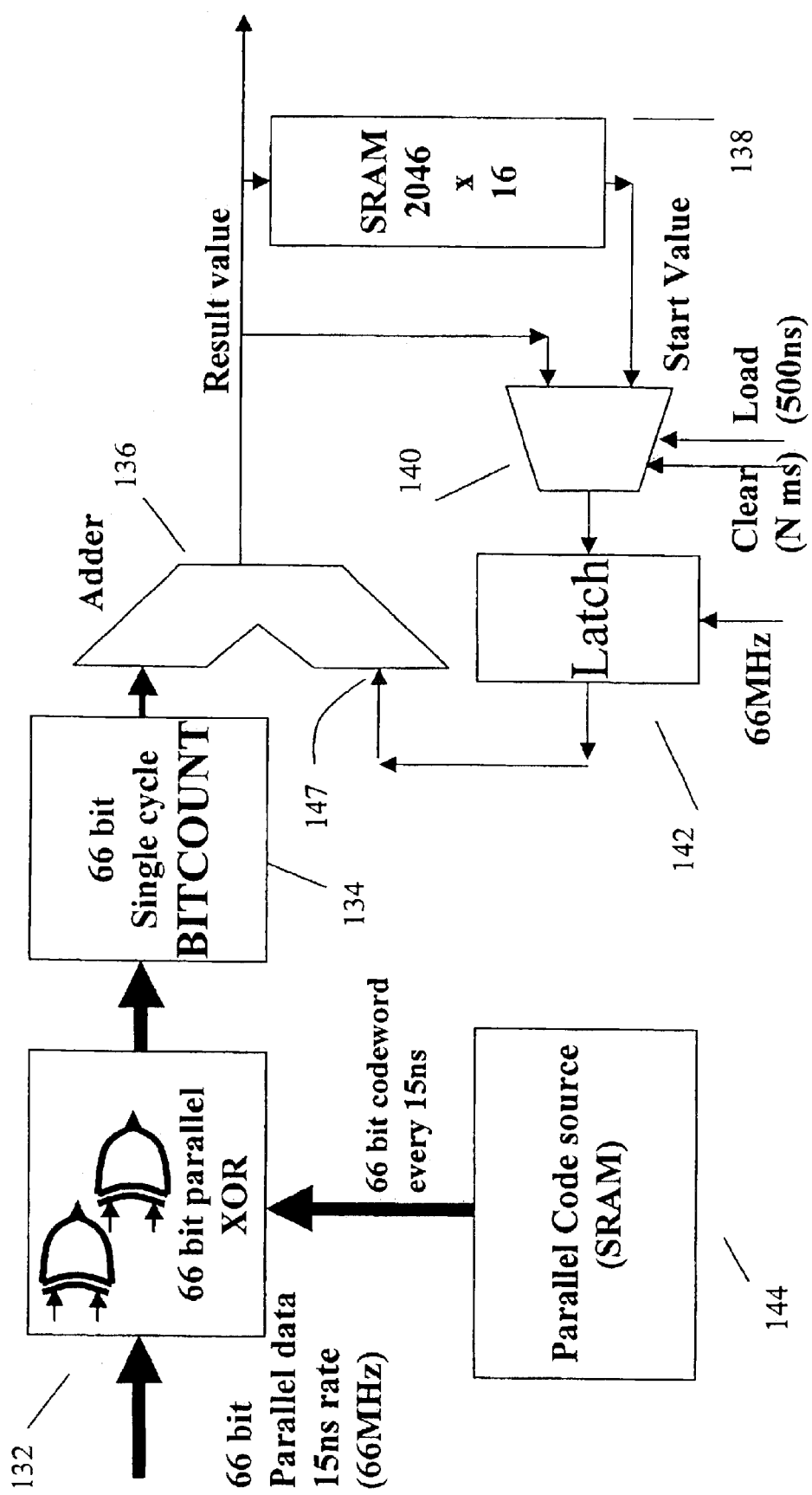
FIG. 7: shows an embodiment of the correlator for first integration of FIG. 3 in greater detail.

Turning briefly again to FIG. 3, it can be seen that the data streamer 102 increases the rate of data to the correlators 104 by sending the data 2,046 times or more as will now be described with reference to FIG. 7. A 66-bit parallel XOR arrangement receives the parallel 66-bit received, digitized and combined data on one input, and a locally generated version of the appropriate satellite CA code from a parallel code source 144, here implemented as SRAM. The SRAM provides 66 bits of the 2,046-bit CA code at a rate of 66 MHz to match the incoming 66-bit data. To perform correlations against all possible positions, the local version of the CA code from source 144 is moved one bit each cycle of all 31 words, that is every 31 cycles of the 66 MHz clock. This is done by shifting each 66-bit word of the local CA code each cycle of the 64 MHz clock.

The output of the XOR arrangement 132 is a high number of bits for a high correlation, or a low number for a low correlation for any given 66-bit portion of the CA code at any of the 66 possible positions of that portion. A bit counter 134 receives and counts the number of bits and provides these to adder 136. The adder also receives an input from a stored previous output value of the adder which is stored in SRAM 138 and provided to a second input of adder 136 on line 147, via a latch 142, and multiplexer 140. The multiplexer 140 allows the output of the SRAM 138 or the output of the adder 136 itself to be provided to the second input of the adder 136. The adder arrangement allows the correlations for a given relative position to the received signal and local CA code to be summed and the resultant value is output.

Figure 8:
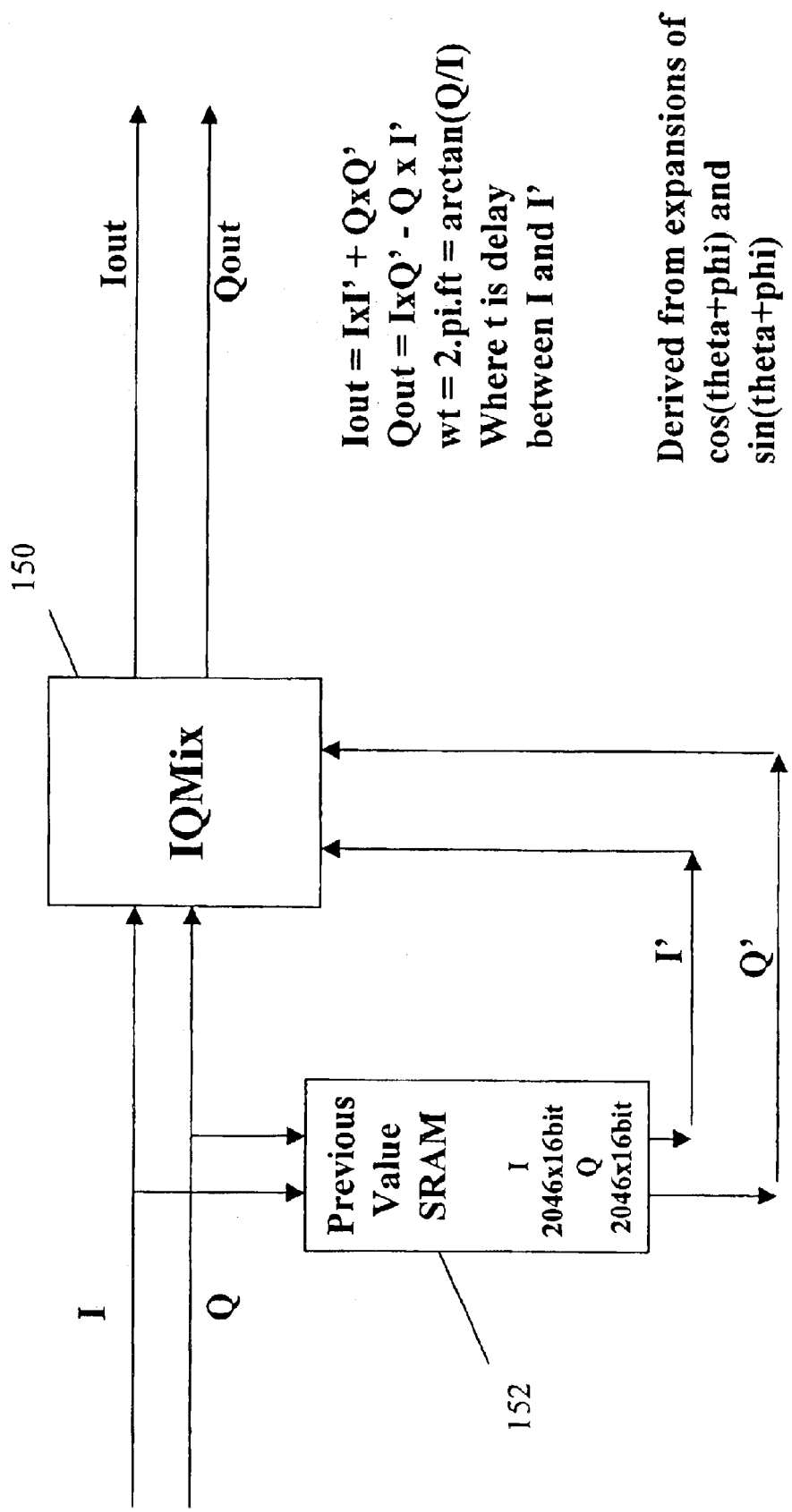
FIG. 8: shows a first embodiment of the frequency-handling component of FIG. 3.

The next stage in processing is to handle any frequency error in the signal caused by local clock errors as shown in FIG. 8. The separate I and Q channels are now processed by a function labeled IQMIX which may be hardware or software, and which performs the mathematical function:

$Iout = I \times I' + Q \times Q'$ $Qout = I \times Q' - Q \times I'$

Figure 9:
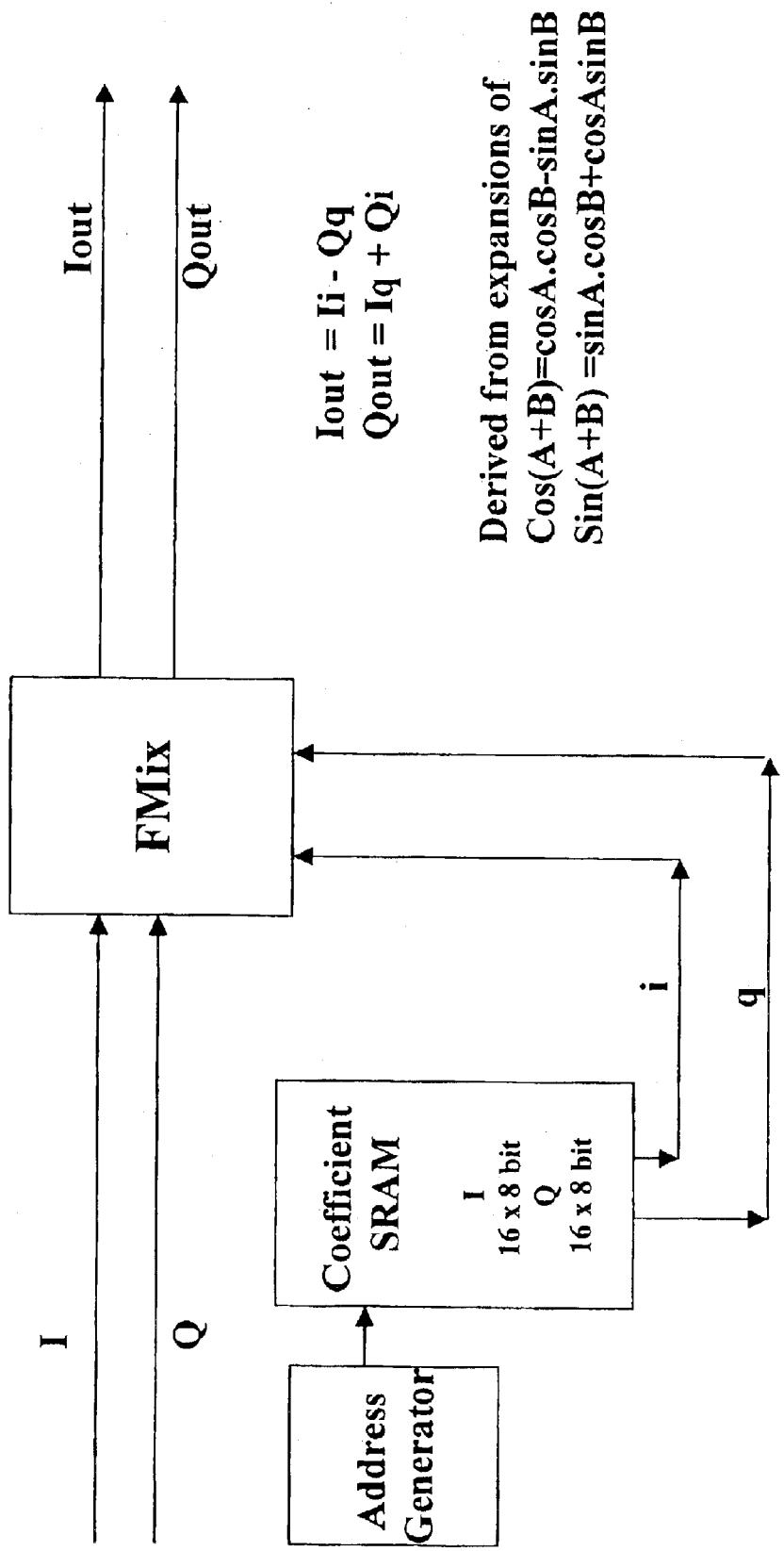
FIG. 9: shows a second embodiment of the frequency-handling component of FIG. 3.
Figure 10:
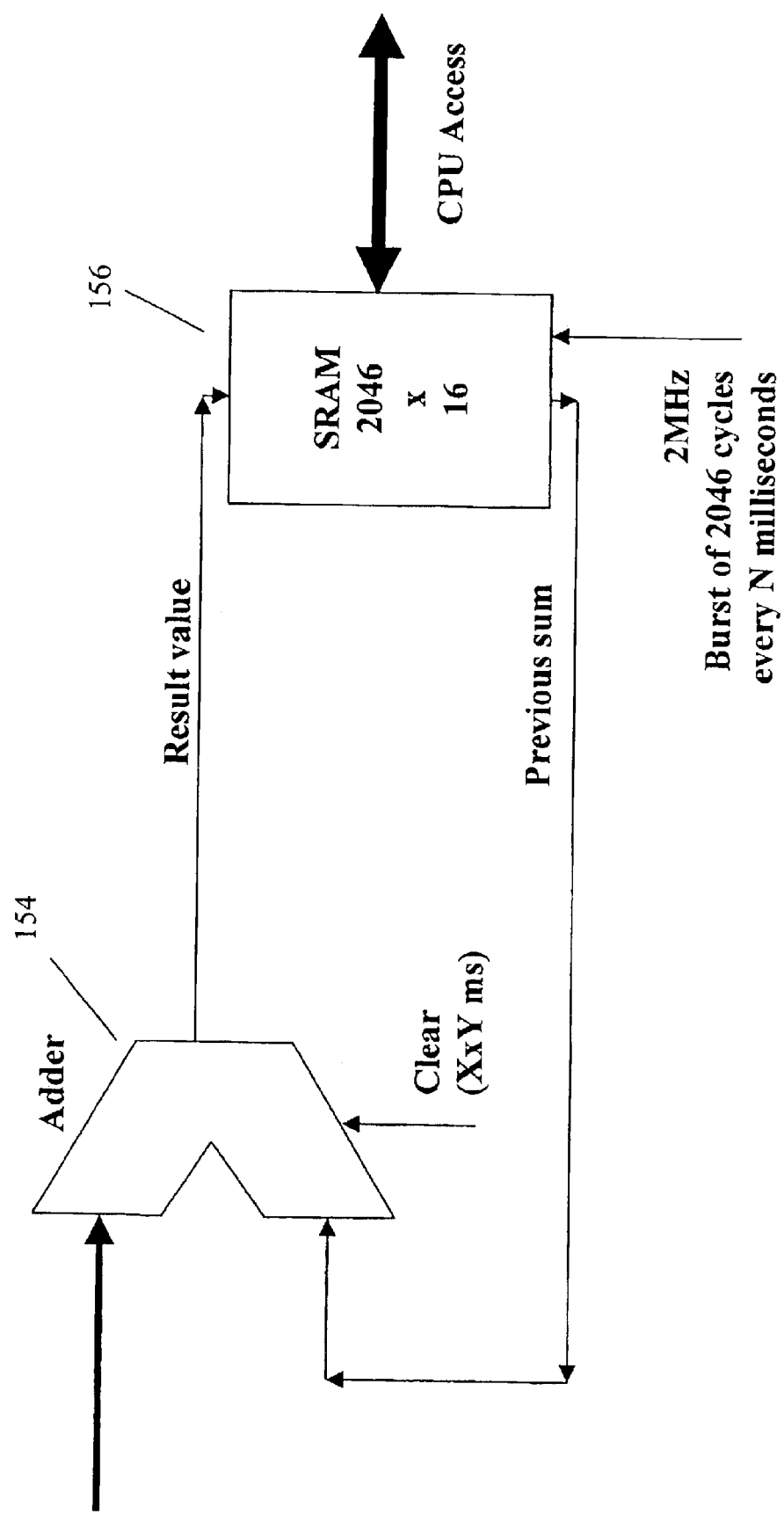
FIG. 10: shows an embodiment of the second integration component of FIG. 3 in greater detail.

These are derived from expansions of cos(theta+phi) and sin(theta+phi), where wt=2.pi.ft=arctan(Q/I) and where t is delay between I and I'. Accordingly, the frequency error is determined by phi, i.e. f=arctan(Q/I)/2.pi. t The previous value SRAM 152 produces delayed version of the I and Q signals for the IQMIX function. The outputs Iout and Qout tolerate any errors in the local clock, and report the error as a phase value. A second integration is performed but is for power only as the signal is now not coherent with the received satellite signal. The second integration is shown in FIG. 10 and comprises summing the Iout or Qout signals with accumulated versions to increase the overall gain. This is by summing in adder 154 with the accumulated previous values stored temporarily in SRAM 156. A full set of at least 2,046 correlations is performed every X milliseconds where and the adder cleared every X×Y milliseconds where Y is programmable. An alternative frequency handling arrangement is shown in FIG. 9, though this is not preferred for existing GPS signals. This arrangement maintains coherence for greater gain for future signals, such as Galileo. Software algorithms in the controlling CPU will optimize the value of X,Y Increasing the integration time (X×Y milliseconds) increases the system gain, however X is limited by data bit edges and as X is increased channel bandwidth is reduced, resulting in the need for more searches. GPS L2, GPS3, Galileo will have data free pilot allowing higher values of X.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A semiconductor integrated circuit for processing a received broadcast signal of a type having a known digital code to acquire the signal, the semiconductor integrated circuit comprising:

a digital sampler configured to sample the received broadcast signal to produce a serial digital bit stream at a first clock rate;

a sample reducer arranged to receive the serial digital bit stream and to combine groups of N samples to produce a reduced serial digital bit stream;

a serial to parallel converter arranged to convert the reduced serial digital bit stream to a parallel bit stream of words comprising M bits, and to output the M bit words at a second clock rate being higher than the first clock rate; and a correlator arrangement arranged to receive the parallel bit stream of M bit words and to correlate in parallel with a locally generated version of the known digital code by correlating one of the M bit words of the parallel bit stream with an M bit word of the locally generated version of the known digital code every cycle of the second clock, wherein an increase in throughput correlation speed is achieved.

2. A semiconductor integrated circuit according to claim 1 wherein the sample reducer comprises a first shift register into which the serial digital bit stream is shifted N samples at a time at the first clock rate.

3. A semiconductor integrated circuit according to claim 2 wherein the sample reducer further comprises a bit counter arranged to count a group of bits in the first shift register and determine a number of bits having a given logic state to produce a bit count.

4. A semiconductor integrated circuit according to claim 3 wherein the sample reducer further comprises a threshold detector arranged to receive the bit count and to produce a 1-bit signal indicative of whether the bit count is greater than a given threshold, to produce the reduced serial digital bit stream.

5. A semiconductor integrated circuit according to claim 4 wherein the bit counter and threshold detector are programmable to set respectively the number of bits counted and the threshold.

6. A semiconductor integrated circuit according to claim 5 wherein the number of bits counted is selectively 7, 9, 11, 13 or 15 bits.

7. A semiconductor integrated circuit according to claim 1 wherein the serial to parallel converter comprises a memory arrangement arranged to receive the reduced serial bit stream and to output M bit words at the second clock rate.

8. A semiconductor integrated circuit according to claim 7 wherein the memory arrangement comprises a second shift register arranged to receive the reduced serial bit stream and to output M bit words.

9. A semiconductor integrated circuit according to claim 8 wherein the memory arrangement comprises first and second circulating shift registers arranged to circulate the M bit words at the second clock rate for output to the correlator arrangement.

10. A semiconductor integrated circuit according to claim 9 wherein the first and second circulating shift registers are arranged wherein one of the first and second circulating shift registers receives a stream of M bit words from the second shift register, while the other circulates at the second clock rate.

11. A semiconductor integrated circuit according to claim 9 wherein the first and second circulating shift registers each have a word depth of a plurality P words.

12. A semiconductor integrated circuit according to claim 11 wherein the first and second circulating shift registers are arranged to circulate each of the plurality P of M bit words many times at the second clock rate.

13. A semiconductor integrated circuit according to according to claim 1 wherein the correlator arrangement comprises a store which stores a local version of the known digital code.

14. A semiconductor integrated circuit according to according to claim 13 wherein the store is arranged to store the local version of the known digital code as a plurality P of M bit words.

15. A semiconductor integrated circuit according to claim 14 wherein the correlator arrangement comprises a comparison arrangement arranged to compare the M bit words of the parallel bit stream with M bit words of the local version of the known digital code.

16. A semiconductor integrated circuit according to claim 15 wherein the comparison arrangement is arranged to receive a different one of the M bit words of the parallel bit stream each clock cycle of the second clock rate and to compare one of the M bit words with a local stored version of the known code.

17. A semiconductor integrated circuit according to claim 16 wherein the local version of the known digital code is stored as a plurality P of M bit words, and every P clock cycles of the second clock rate each M bit word of the local version of the code is shifted one bit with respect to the M bit words of the parallel bit stream.

18. A semiconductor integrated circuit according to according to claim 15 wherein the comparison arrangement comprises parallel XOR gates.

19. A semiconductor integrated circuit according to claim 1 wherein the known digital signal is a repeated code signal having a code repeat period, code length and a code frequency, and wherein the sample reducer, serial to parallel converter and correlator arrangement are arranged to perform all possible correlations in the code repeat period.

20. A semiconductor integrated circuit according to claim 1 wherein the known code is a GPS code.

21. A semiconductor integrated circuit according to claim 1 wherein N=8.

22. A semiconductor integrated circuit according to claim 1 wherein M=66.

23. A semiconductor integrated circuit according to claim 1 wherein the first clock rate is substantially 16 MHz.

24. A semiconductor integrated circuit according to claim 1 wherein the second clock rate is substantially 64 MHz.

25. A semiconductor integrated circuit according to claim 1 wherein the increase in correlation speed is N×M×second clock rate/first clock rate.

26. A system to process a received signal of a type having a digital code, the system comprising:

a sampler unit to sample the received signal to produce a serial digital bit stream at a first clock rate;

a sample reducer unit coupled to the sampler unit to receive the serial digital bit stream and to combine groups of samples to produce a reduced serial digital bit stream;

a converter unit coupled to the sample reducer unit to convert the reduced serial digital bit stream to a parallel bit stream of words and to output the words at a second clock rate; and a correlator unit coupled to the converter unit to receive the parallel bit stream of words and to correlate one of the words in parallel with a word of the digital code for a plurality of cycles of the second clock rate.

27. The system of claim 26, further comprising a frequency handling unit coupled to the correlator unit to correct frequency errors in a correlation throughput from the correlator unit.

28. The system of claim 27, further comprising an integration unit coupled to the frequency handling unit to sum outputs of the frequency handling unit with accumulated output values.

29. The system of claim 26 wherein the sampler reducer unit includes:

a first shift register;

a bit counter coupled to the shift register;

a threshold detector coupled to the bit counter; and a second shift register coupled to the threshold detector.

30. The system of claim 26 wherein the converter unit comprises a serial to parallel converter having a pair of circulating shift registers.

31. A method to process a received signal of a type having a digital code, the method comprising:

sampling the received signal to produce a serial digital bit stream at a first clock rate;

combining groups of samples to produce a reduced serial digital bit stream;

converting the reduced serial digital bit stream to a parallel bit stream of words and outputting the words at a second clock rate; and correlating one of the words in parallel with a word of the digital code for a plurality of cycles of the second clock rate to increase correlation throughput.

32. The method of claim 31, further comprising:

correcting frequency errors in the correlation throughput and producing an output; and summing outputs with accumulated output values.

33. The method of claim 31, further comprising locally generating a version of the digital code.

34. A system for processing a received signal of a type having a digital code, the system comprising:

a means for sampling the received signal to produce a serial digital bit stream at a first clock rate;

a means for combining groups of samples to produce a reduced serial digital bit stream;

a means for converting the reduced serial digital bit stream to a parallel bit stream of words and outputting the words at a second clock rate; and a means for correlating one of the words in parallel with a word of the digital code for a plurality of cycles of the second clock rate to increase correlation throughput.

35. The system of claim 34, further comprising:

a means for correcting frequency errors in the correlation throughput and producing an output; and a means for summing outputs with accumulated output values.

* * * * *

UNITED STATES PATENT AND TRADEMARK OFFICE
CERTIFICATE OF CORRECTION

PATENT NO. : 6,845,124 B2
DATED : January 18, 2005
INVENTOR(S) : Philip Mattos et al.

It is certified that error appears in the above-identified patent and that said Letters Patent is hereby corrected as shown below:

Title page,
Item [73], Assignee, the second listed should read as:
-- STMicroelectronics Limited --.
Item [30], Foreign Application Priority Data, should read as:
-- August 2, 2002 (EP) ......... 02255423.2 --.

Signed and Sealed this

Sixth Day of September, 2005

JON W. DUDAS
*Director of the United States Patent and Trademark Office*